(12) United States Patent
Cai et al.

(10) Patent No.: US 11,404,549 B2
(45) Date of Patent: Aug. 2, 2022

(54) SPLIT GATE FLASH MEMORY CELLS WITH A TRENCH-FORMED SELECT GATE

(71) Applicant: GLOBALFOUNDRIES Singapore Pte. Ltd., Singapore (SG)

(72) Inventors: Xinshu Cai, Singapore (SG); Shyue Seng Tan, Singapore (SG); Eng Huat Toh, Singapore (SG); Kiok Boone Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/026,436

(22) Filed: Sep. 21, 2020

(65) Prior Publication Data
US 2022/0093765 A1    Mar. 24, 2022

(51) Int. Cl.
| | | |
|---|---|---|
| H01L 29/788 | (2006.01) | |
| H01L 21/28 | (2006.01) | |
| H01L 29/423 | (2006.01) | |
| H01L 29/66 | (2006.01) | |
| H01L 29/78 | (2006.01) | |
| H01L 29/08 | (2006.01) | |

(52) U.S. Cl.
CPC .... *H01L 29/42336* (2013.01); *H01L 29/0847* (2013.01); *H01L 29/40114* (2019.08); *H01L 29/66825* (2013.01); *H01L 29/7831* (2013.01); *H01L 29/7883* (2013.01)

(58) Field of Classification Search
None
See application file for complete search history.

(56) References Cited

U.S. PATENT DOCUMENTS

| | | | |
|---|---|---|---|
| 6,894,339 B2 | 5/2005 | Fan et al. | |
| 2006/0148177 A1* | 7/2006 | Kim | H01L 29/7881 438/267 |
| 2018/0197963 A1* | 7/2018 | La Rosa | H01L 29/7883 |

OTHER PUBLICATIONS

F. L. Rosa, S. Niel, A. Regnier, F. Maugain, M. Mantelli and A. Conte, "40nm embedded Select in Trench Memory (eSTM) Technology Overview," 2019 IEEE 11th International Memory Workshop (IMW), Monterey, CA, USA, 2019, pp. 1-4, doi: 10.1109/IMW.2019.8739731.

* cited by examiner

*Primary Examiner* — Xiaoming Liu
(74) *Attorney, Agent, or Firm* — Thompson Hine LLP

(57) ABSTRACT

Structures for a split gate flash memory cell and methods of forming a structure for a split gate flash memory cell. A trench is formed in a semiconductor substrate. First and second source/drain regions are formed in the semiconductor substrate. A first gate is laterally positioned between the trench and the second source/drain region, and a second gate includes a portion inside the trench. The first source/drain region is located in the semiconductor substrate beneath the trench. A dielectric layer is positioned between the portion of the second gate inside the trench and the semiconductor substrate.

19 Claims, 5 Drawing Sheets

SPLIT GATE FLASH MEMORY CELLS WITH A TRENCH-FORMED SELECT GATE

BACKGROUND

The invention relates generally to integrated circuits and semiconductor device fabrication and, more specifically, to structures for a split gate flash memory cell and methods of forming a structure for a split gate flash memory cell.

Non-volatile memories are utilized in various electronic products for general storage and transfer of data. Stored data is retained by a non-volatile memory device when the memory cells are not powered. The persistence of data storage by a non-volatile memory device contrasts with volatile memory technologies, such as a static random-access memory (SRAM) device in which stored data is eventually lost when the memory cells are unpowered and a dynamic random-access memory (DRAM) device in which stored data is lost if the memory cells are not periodically refreshed.

Flash memory is a particular type of non-volatile memory that can be repeatedly programmed and erased. Embedded flash memory may be used to store configuration settings, program code, application parameters, and other types of data in consumer, industrial, and automotive electronic products. A memory cell of a flash memory resembles a standard metal-oxide-semiconductor field-effect transistor, but is equipped with a pair of gates instead of a single gate. Current flow in a channel region between the source and drain is controlled by cooperation between a floating gate and a control gate. The control gate is similar to a standard transistor gate. However, the floating gate is surrounded and encased by a tunneling oxide layer. The floating gate is positioned between the control gate and the channel region. Charge is transferred to the floating gate and removed from the floating gate by tunneling through the tunneling oxide layer. Charge stored on the floating gate influences the device threshold voltage and thereby provides the different memory logic states. In a split gate flash memory cell design, the control gate partially overlaps with the floating gate and partially overlaps with the channel region, which may significantly improve data erase times.

Improved structures for a split gate flash memory cell and methods of forming a structure for a split gate flash memory cell are needed.

SUMMARY

In an embodiment, a structure for a split gate flash memory cell is provided. The structure includes a semiconductor substrate having a trench, a first source/drain region and a second source/drain region in the semiconductor substrate, a first gate laterally positioned between the trench and the second source/drain region, and a second gate having a portion inside the trench. The first source/drain region is located beneath the trench. A dielectric layer is positioned between the portion of the second gate inside the trench and the semiconductor substrate.

In an embodiment, a method of forming a structure for a split gate flash memory cell is provided. The method includes forming a trench in a semiconductor substrate, forming a first source/drain region and a second source/drain region in the semiconductor substrate, forming a first gate laterally positioned between the trench and the second source/drain region, forming a dielectric layer inside the trench, and forming a second gate including a portion inside the trench. The first source/drain region is located in the semiconductor substrate beneath the trench, and the dielectric layer is positioned between the portion of the second gate inside the trench and the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
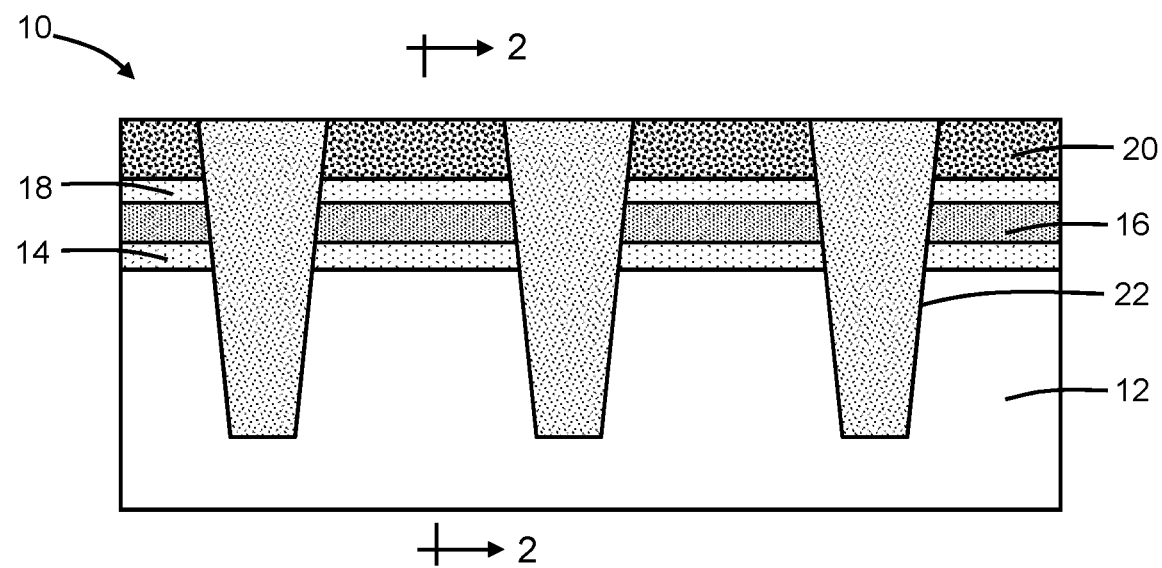
FIG. 1 is a cross-sectional view of a structure for a split gate flash memory cell in accordance with embodiments of the invention.
Figure 2:
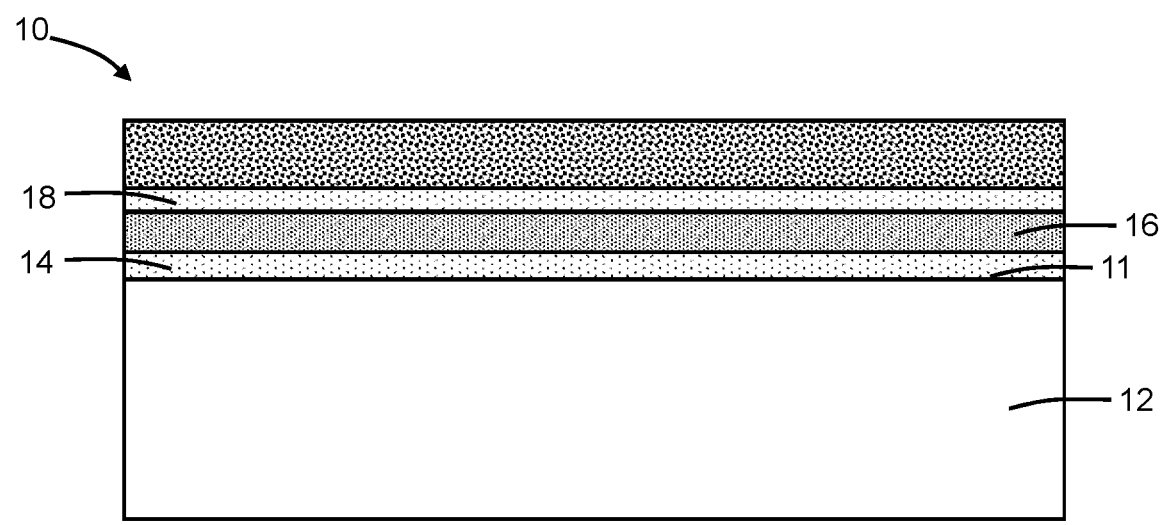
FIG. 2 is a cross-sectional view taken generally along line 2-2 in FIG. 1

With reference to FIGS. 1, 2 and in accordance with embodiments of the invention, a structure 10 for a split gate flash memory cell includes multiple layers 14, 16, 18 formed in a layer stack on a top surface 11 of a semiconductor substrate 12. The semiconductor substrate 12 may be comprised of a single-crystal semiconductor material, such as single-crystal silicon, and may be lightly doped to have p-type conductivity. The layer 14 and the layer 18 may be comprised of a dielectric material, such as silicon dioxide, that is deposited by chemical vapor deposition, and the layer 16 may be comprised of an electrical conductor, such as doped polycrystalline silicon (polysilicon), that is deposited by chemical vapor deposition. In an alternative embodiment, the layer 16 may be comprised of a dielectric material, such as silicon nitride.

A hardmask 20 is applied and patterned with lithography and etching processes to define openings at intended locations for subsequently-formed trench isolation regions 22. An etching process, such as a reactive ion etching process, is used to form trenches at the locations of the openings in the hardmask 20 that extend fully through the layers 14, 16, 18 and to a shallow depth into the semiconductor substrate 12. The trenches are subsequently filled with a dielectric material and planarized with chemical-mechanical polishing to define the trench isolation regions 22. The dielectric material comprising the trench isolation regions 22 may be, for example, silicon dioxide. The hardmask 20 may be removed, and the trench isolation regions 22 may then be recessed. The trench isolation regions 22 surround an active region of the semiconductor substrate 12.

The formation of the trench isolation regions 22 divides the layers 14, 16, 18 into sections that are subsequently used to form a floating gate for the structure 10. The sectioning of the layers 14, 16, 18 eliminates the need for a chemical-mechanical polishing process to planarize the material of the floating gate during its formation.

Figure 3:
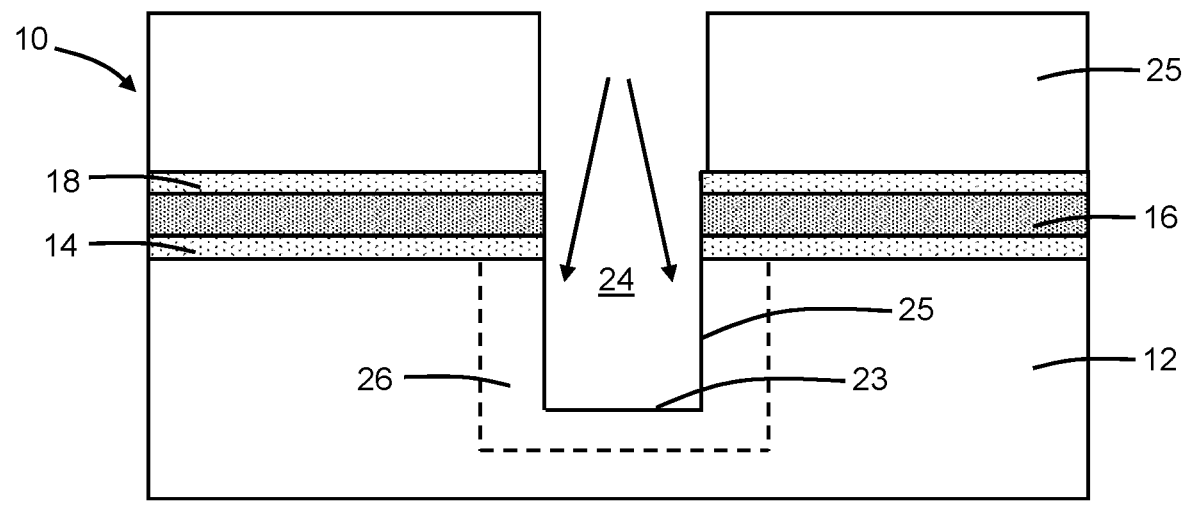
FIGS. 3-6 are cross-sectional views of the structure at successive fabrication stages subsequent to FIG. 2.

With reference to FIG. 3 in which like reference numerals refer to like features in FIG. 2 and at a subsequent fabrication stage of the processing method, a trench 24 is formed that extends fully through the layers 14, 16, 18 and into the semiconductor substrate 12. The trench 24 may be formed by patterning with lithography and etching processes. The trench 24 is positioned in an active region of the semiconductor substrate 12 that is surrounded by the trench isolation regions 22. The trench 24 has a bottom 23 in the semiconductor substrate 12 and sidewalls 25 that extend to the bottom 23. The trench 24 is located in part in the semiconductor substrate 12 and in part between different sections of the layers 14, 16, 18.

A well 26 is formed in a portion of the semiconductor substrate 12 surrounding the trench 24. In an embodiment, the well 26 may be formed by introducing a dopant by ion implantation, as diagrammatically shown by the single-headed arrows, with given implantation conditions into the semiconductor substrate 12 proximate to the bottom 23 and sidewalls 25 of the trench 24. A patterned implantation mask may be formed to define a selected area that is exposed for the implantation. The implantation mask covers a masked area of the semiconductor substrate 12 that surrounds the unmasked area about the trench 24. The implantation mask may include a layer of a material, such as an organic photoresist, that is applied and lithographically patterned such that the vicinity of the trench 24 is unmasked. The implantation mask may have a thickness and stopping power sufficient to block the semiconductor substrate 12 beneath the masked area against receiving a dose of the implanted ions.

The implantation conditions (e.g., ion species, dose, kinetic energy, tilt angle) may be selected to tune the electrical and physical characteristics of the well 26. In an embodiment, the well 26 may be implanted with a p-type dopant (e.g., boron) to provide semiconductor material with p-type conductivity. In an alternative embodiment, the well 26 may be implanted with an n-type dopant (e.g., phosphorus and/or arsenic) to provide semiconductor material with n-type conductivity. The well 26 may provide doping for a channel region of the structure 10.

Figure 4:
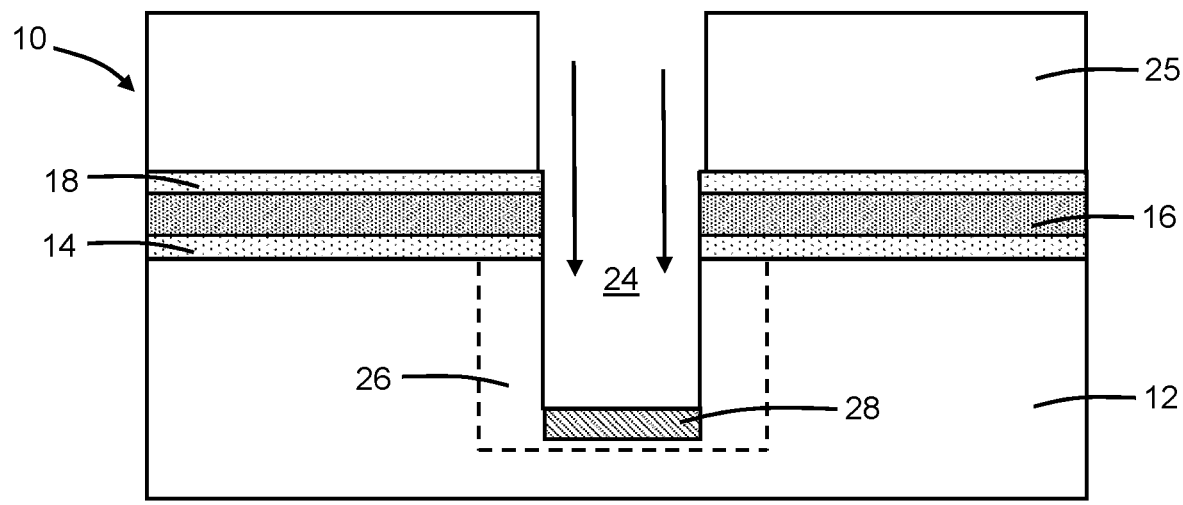

With reference to FIG. 4 in which like reference numerals refer to like features in FIG. 3 and at a subsequent fabrication stage of the processing method, a doped region 28 is formed in the semiconductor substrate 12 at the bottom 23 (FIG. 3) of the trench 24. In an embodiment, the doped region 28 may be formed by introducing a dopant by ion implantation, as diagrammatically shown by the single-headed arrows, with given implantation conditions into the semiconductor substrate 12. The patterned implantation mask used to form the well 26 may also be used to form the doped region 28. The doped region 28 extends in the semiconductor substrate 12 along the length of the trench 24. In an embodiment, the doped region 28 may extend in the semiconductor substrate 12 along the full length of the trench 24.

The implantation conditions (e.g., ion species, dose, kinetic energy) may be selected to tune the electrical and physical characteristics of the doped region 28. The doped region 28 is doped to have an opposite conductivity type from the well 26. In an embodiment, the doped region 28 may contain semiconductor material doped with an n-type dopant (e.g., phosphorus and/or arsenic) to provide n-type conductivity. In an alternative embodiment, the doped region 28 may contain semiconductor material doped with a p-type dopant (e.g., boron) to provide p-type conductivity. The doped region 28 may provide a source for the structure 10.

Figure 5:
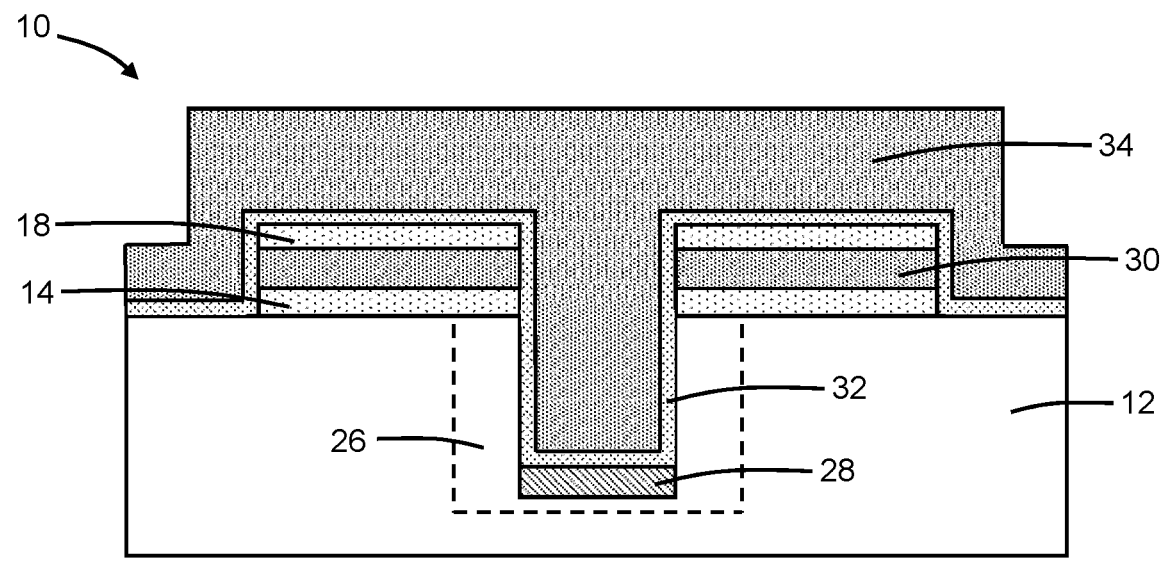

With reference to FIG. 5 in which like reference numerals refer to like features in FIG. 4 and at a subsequent fabrication stage of the processing method, the layers 14, 16, 18 are patterned with lithography and etching processes. A floating gate 30 is defined by the patterned layer 16. A patterned portion of the layer 14 is arranged below the floating gate 30, and a patterned portion of the layer 18 is arranged above the floating gate 30 such that the top and bottom surfaces of the floating gate 30 are clad by the dielectric material of the layers 14, 18. The floating gate 30, which is positioned above the top surface 11 of the semiconductor substrate 12, surrounds the trench 24.

A tunnel oxide layer 32 is formed as a dielectric layer that conformally coats the sidewalls 25 and bottom 23 (FIG. 3) of the trench 24. A conductor layer 34 is deposited over the tunnel oxide layer 32, and the conductor layer 34 includes a portion that fills the space inside the trench 24 not occupied by the tunnel oxide layer 32. The tunnel oxide layer 32 is comprised of a dielectric material having a high resistivity, and the conductor layer 34 is comprised of a conductive material having a low resistivity. In an embodiment, the tunnel oxide layer 32 may be comprised of silicon dioxide deposited by atomic layer deposition, and the conductor layer 34 may be comprised of doped polycrystalline silicon (i.e., doped polysilicon) deposited by chemical vapor deposition.

Figure 6:
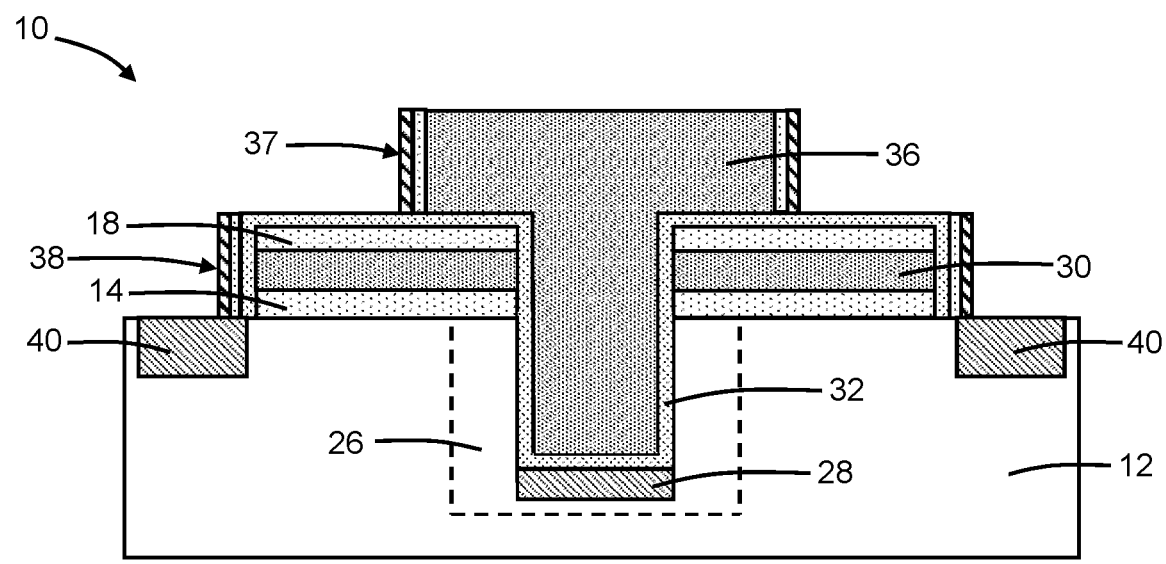

With reference to FIG. 6 in which like reference numerals refer to like features in FIG. 5 and at a subsequent fabrication stage of the processing method, the tunnel oxide layer 32 and the conductor layer 34 are patterned by forming an etch mask with lithography and then etching with an etching process, such as a reactive ion etching process. The patterning of the conductor layer 34 defines a select gate 36. A portion of the select gate 36 extends over the floating gate 30, and another portion of the select gate 36 is positioned inside the trench 24. The portion of the select gate 36 positioned inside the trench 24 extends along the length of the trench 24 at a level above the doped region 28. The floating gate 30 is surrounded by the dielectric material of the layers 14, 18 and the dielectric material of the tunnel oxide layer 32. The floating gate 30 surrounds a portion of the select gate 36.

A portion of the tunnel oxide layer 32 is positioned between the floating gate 30 and the select gate 36. Another portion of the tunnel oxide layer 32 is positioned inside the trench 24 above the doped region 28 and laterally between the select gate 36 and the semiconductor substrate 12. Another portion of the tunnel oxide layer 32 is positioned at the bottom 23 of the trench 24 over the doped region 28 and between the doped region 28 and the select gate 36.

A bilayer spacer 37 is formed that extends about the periphery of an upper portion of the select gate 36. A bilayer spacer 38 is also formed that extends about the periphery of the floating gate 30. The bilayer spacers 37, 38 may be formed by conformally depositing a layer stack of dielectric materials and etching the layer stack with a directional or anisotropic etching process, such as reactive ion etching.

A doped region 40 is formed in the semiconductor substrate 12 and is laterally arranged offset relative to the gates 30, 36 and the trench 24. The doped region 40 is also laterally arranged offset relative to the doped region 28 beneath the bottom 23 of the trench 24. The doped region 40 may have the same conductivity type as the doped region 28. In an embodiment, the semiconductor material of the doped region 40 may be heavily doped with an n-type dopant (e.g., phosphorus and/or arsenic) to provide n-type conductivity. In an alternative embodiment, the semiconductor material of the doped region 40 may be heavily doped with a p-type dopant (e.g., boron) to provide p-type conductivity. The doped region 40 may be formed by implanting ions (e.g., ions of the n-type dopant) into the semiconductor substrate 12 with an implantation mask present over the structure 10. The implantation mask defines the intended location for the doped region 40 in the semiconductor substrate 12.

A channel region is defined in the semiconductor substrate 12 between the doped region 40 and the doped region 28. The doped region 40 may provide a drain for the structure 10, and the doped region 28 may provide a source for the structure 10 that is laterally spaced from the drain.

Middle-of-line (MOL) processing and back-end-of-line (BEOL) processing follow, which include formation of an interconnect structure coupled with the structure 10. The interconnect structure may include separate contacts that are coupled with the select gate 36 and the doped regions 28, 40. The floating gate 30 is not contacted by contacts in the middle-of-line portion of the interconnect structure and is instead electrically isolated.

In use, the structure 10 can be programmed by placing positive voltages on the select gate 36 and doped region 40 and a current on the doped region 28, to inject electrons from the current flowing through the channel region onto the floating gate 30. For example, to program the structure 10, 1.5 volts may be applied to the select gate 36, 8 volts may be applied to the doped region 40, and 1 microamp of current may be applied to the doped region 28. The floating gate 30 is negatively charged when placed in the programmed state. The structure 10 can be erased by placing a high positive voltage (e.g., 12 volts) on the select gate 36 and applying a ground potential to the doped regions 28, 40 to induce tunneling of electrons from the floating gate 30 to the select gate 36. The floating gate 30 is positively charged when placed in the erased state. The structure 10 can be read by placing positive voltages on the select gate 36 and doped region 40, applying a ground potential to the doped region 28, and sensing current flow. For example, to read the structure 10, 2.5 volts may be applied to the select gate 36, 0.8 volts may be applied to the doped region 40, and the doped region 28 may be grounded.

The select gate 36 functions as both an erase gate and a word line in the structure 10, which lacks a control gate. The dual-function select gate 36 can be biased to program the structure and biased to erase the structure 10, which simplifies the construction because a separate erase gate is not required. The placement of a portion of the select gate 36 inside the trench 24 promotes a reduction in the size of the structure 10 and an increased device density relative to conventional split gate flash memory cells.

Figure 7:
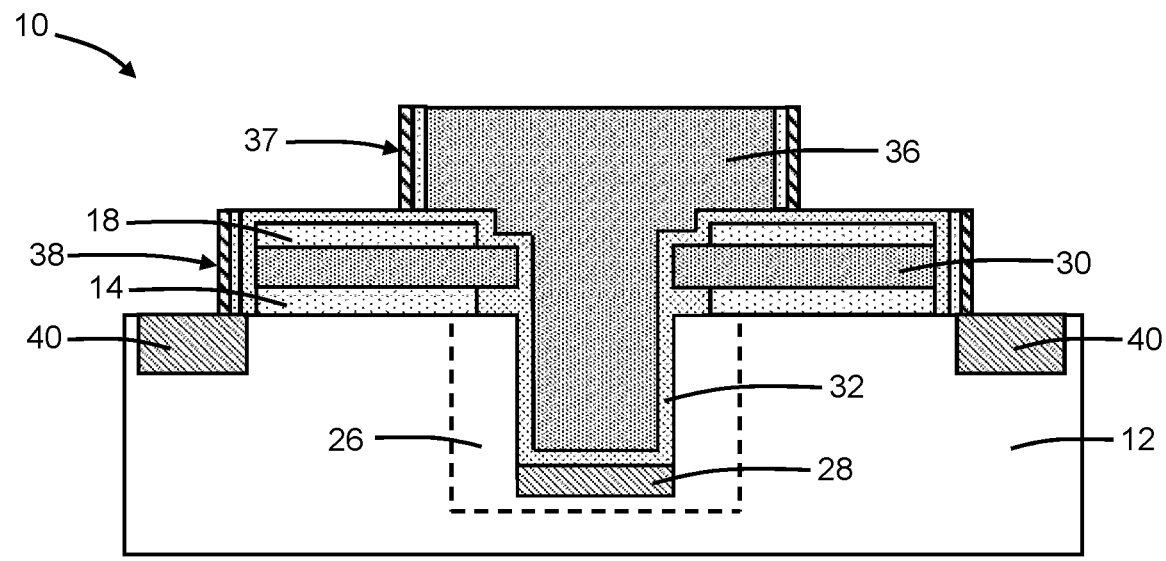
FIGS. 7-10 are cross-sectional views of structures in accordance with alternative embodiments of the invention.

With reference to FIG. 7 in which like reference numerals refer to like features in FIG. 6 and in accordance with embodiments of the invention, a portion of the layer 18 and a portion of the layer 14 may be removed by a selective isotropic etching process, and replaced by deposited portions of the tunnel oxide layer 32. A portion of the select gate 36 overlaps or overhangs a portion of the floating gate 30 with only the tunnel oxide layer 32 providing an insulating separator of dielectric material between these overlapping portions. Another portion of the select gate 36, which also overlaps with the floating gate 30, is still separated from the floating gate 30 by an insulating separator of dielectric material provided by a combination of the layer 18 and the tunnel oxide layer 32.

Figure 8:
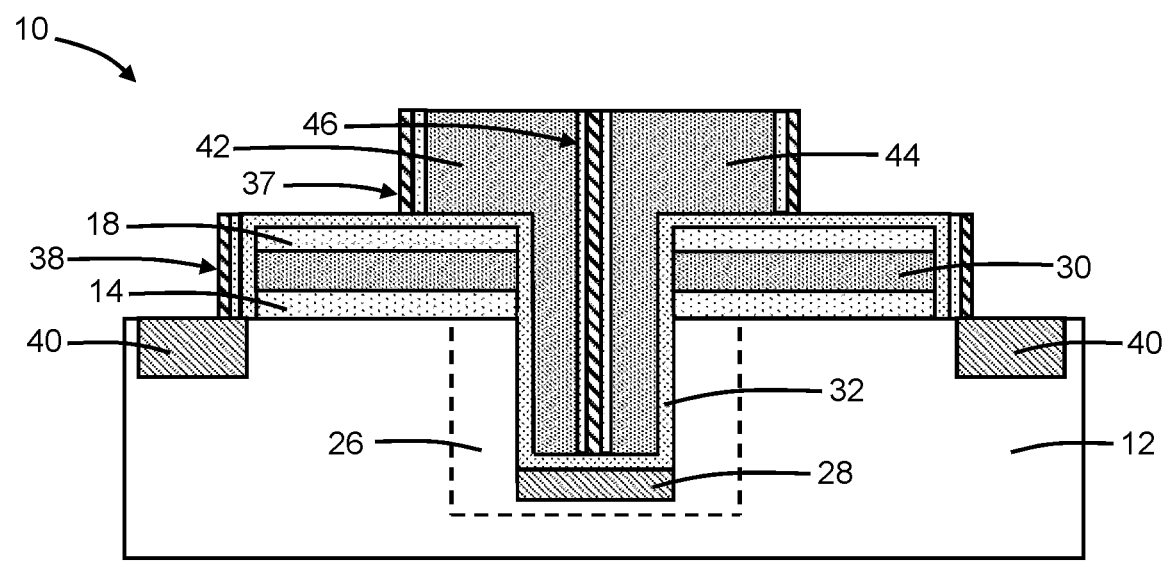

With reference to FIG. 8 in which like reference numerals refer to like features in FIG. 6 and in accordance with embodiments of the invention, the structure 10 may be modified by splitting the select gate 36 into a section 42 and a section 44 to provide a fully decoded device. To that end, the select gate 36 may be patterned with lithography and etching processes to define an opening extending through the select gate 36 to the tunnel oxide layer 32 over the doped region 28 at the bottom 23 of the trench 24 and a bilayer spacer 46 may be formed inside the opening. In an embodiment, the bilayer spacer 46 may be formed when the bilayer spacers 37, 38 are formed and include the same dielectric materials. The bilayer spacer 46 provides an isolation pillar that electrically isolates the section 42 from the section 44 such that the select gate sections 42, 44 may be separately contacted. In an alternative embodiment, an overhang of the each of the select gate sections 42, 44 with the floating gate 30 may be provided by removing a portion of the layer 18 before depositing the tunnel oxide layer 32, as described in connection with FIG. 7.

Figure 9:
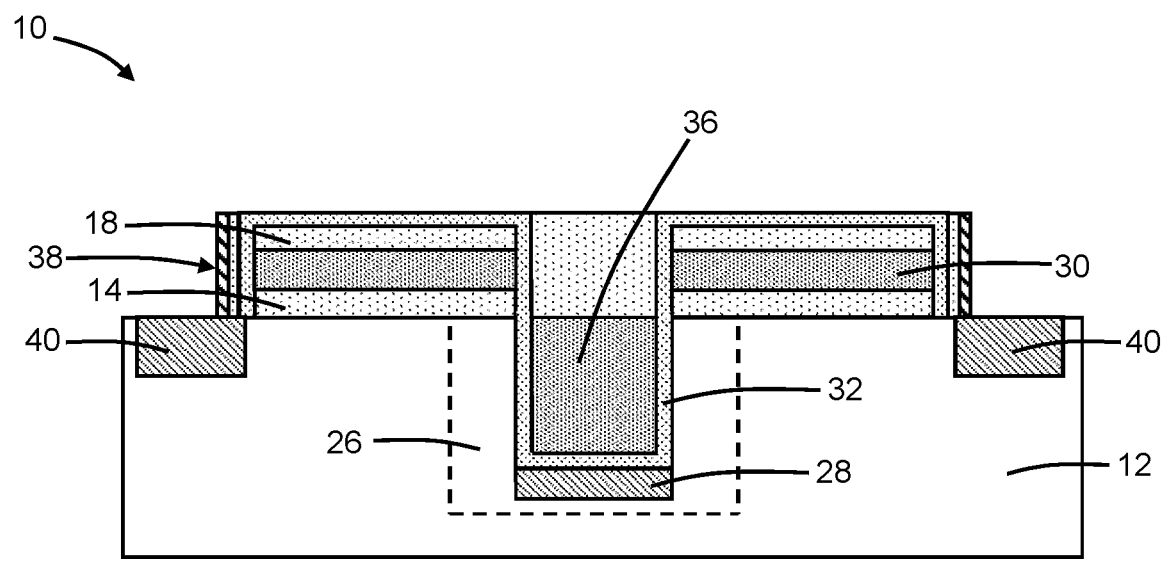

With reference to FIG. 9 in which like reference numerals refer to like features in FIG. 6 and in accordance with embodiments of the invention, the select gate 36 may be coplanar or substantially coplanar with the top surface 11 of the semiconductor substrate 12 and located at and below the top surface 11 of the semiconductor substrate 12. The select gate 36 may be recessed after patterning to provide the arrangement inside the trench 24 that is fully below the top surface 11.

Figure 10:
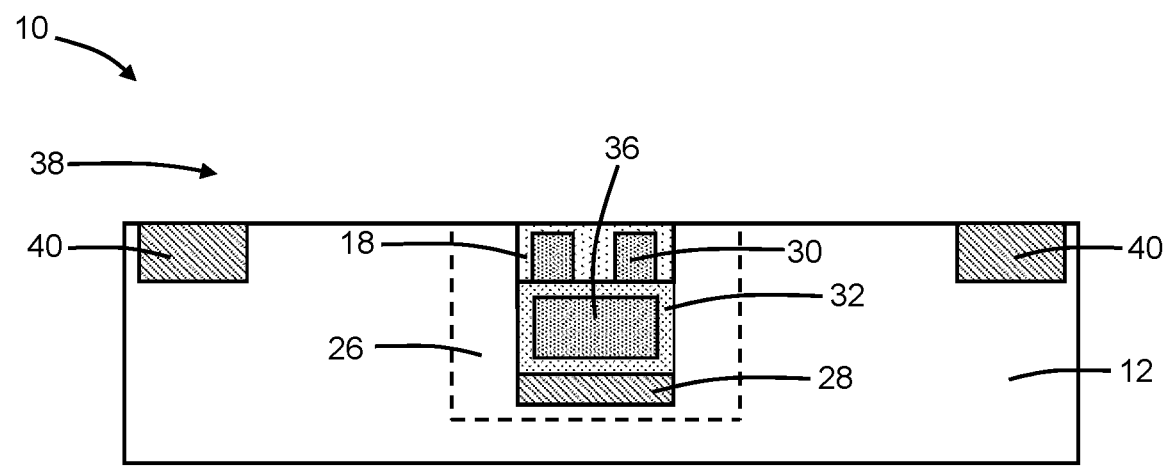

With reference to FIG. 10 in which like reference numerals refer to like features in FIG. 9 and in accordance with embodiments of the invention, the select gate 36 and the floating gate 30 may both be located fully below the top surface 11 of the semiconductor substrate 12 and, in particular, may be arranged between the select gate 36 and the top surface 11 of the semiconductor substrate 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a flash memory cell, the structure comprising:
    a semiconductor substrate including a trench;
    a first source/drain region and a second source/drain region in the semiconductor substrate, the first source/drain region located beneath the trench;
    a well in a portion of the semiconductor substrate surrounding the trench, the well providing a channel region disposed between the first source/drain region and the second source/drain region;
    a first gate laterally positioned between the trench and the second source/drain region;
    a second gate including a first portion inside the trench and a second portion above the first portion, the second portion of the second gate extending laterally to overlap with the first gate;
    a first dielectric layer including a first portion inside the trench, the first portion of the first dielectric layer positioned between the first portion of the second gate and the semiconductor substrate; and
    a second dielectric layer positioned between the first gate and the first dielectric layer.

2. The structure of claim 1 wherein the second dielectric layer fully covers the first gate.

3. The structure of claim 1 wherein the first gate includes a first portion and a second portion, the first dielectric layer covers the first portion of the first gate, and the first dielectric layer and the second dielectric layer cover the second portion of the first gate with the second dielectric layer disposed between the first dielectric layer and the second portion of the first gate.

4. The structure of claim 3 wherein the first portion of the first gate is positioned adjacent to the trench.

5. The structure of claim 1 wherein the first portion of the second gate includes a first section and a second section, and further comprising:
    an isolation pillar positioned between the first section and the second section of the second gate, the isolation pillar comprised of a dielectric material.

6. The structure of claim 1 wherein the semiconductor substrate has a top surface, and the first gate is positioned over the top surface of the semiconductor substrate.

7. The structure of claim 1 wherein the semiconductor substrate has a top surface, and the first portion of the second gate is positioned fully beneath the top surface of the semiconductor substrate.

8. The structure of claim 1 wherein the first dielectric layer includes a second portion positioned between the second portion of the second gate and the first gate.

9. The structure of claim 8 wherein the semiconductor substrate has a top surface, and the second portion of the second gate is positioned above the top surface of the semiconductor substrate.

10. The structure of claim 8 wherein the first gate surrounds the second portion of the second gate.

11. The structure of claim 1 wherein the first portion of the second gate includes a first section and a second section, and further comprising:
    an insulating separator positioned between the first section and the second section of the second gate.

12. The structure of claim 1 wherein the second gate is configured to be biased to program the flash memory cell and biased to erase the flash memory cell.

13. The structure of claim 1 wherein the first portion of the second gate and the first portion of the first dielectric layer fully fill a space inside the trench.

14. The structure of claim 1 wherein the first source/drain region extends along a length of the trench and the first portion of the second gate.

15. A method of forming a structure for a flash memory cell, the method comprising:
    forming a trench in a semiconductor substrate;
    forming a first source/drain region and a second source/drain region in the semiconductor substrate;
    forming a well in a portion of the semiconductor substrate that surrounds the trench, wherein the well provides a channel region disposed between the first source/drain region and the second source/drain region;
    forming a first gate laterally positioned between the trench and the second source/drain region;
    forming a first dielectric layer including a portion inside the trench; and
    forming a second gate including a first portion inside the trench and a second portion above the first portion, wherein the second portion of the second gate extends laterally to overlap with the first gate,
    wherein a second dielectric layer is positioned between the first gate and the first dielectric layer, the first source/drain region is located in the semiconductor substrate beneath the trench, and the portion of the first dielectric layer is positioned between the portion of the second gate and the semiconductor substrate.

16. The method of claim 15 wherein forming the first gate laterally positioned between the trench and the second source/drain region comprises:
    patterning a layer stack including a layer comprised of a material to form the first gate.

17. The method of claim 15 wherein forming the first source/drain region and the second source/drain region in the semiconductor substrate comprises:
    implanting ions into the semiconductor substrate beneath a bottom of the trench to form the first source/drain region.

18. The method of claim 15 wherein forming the second gate including the portion inside the trench comprises:
    after forming the first dielectric layer, depositing a material on the first dielectric layer that fills the trench; and
    patterning the material to form the second gate.

19. The method of claim 16 wherein the second dielectric layer is patterned when the material is patterned, the second dielectric layer is positioned over the first gate, and further comprising:

laterally recessing the second dielectric layer before forming the first dielectric layer and the second gate.

* * * * *